US008264535B2

(12) United States Patent
Kienzle et al.

(10) Patent No.: US 8,264,535 B2
(45) Date of Patent: Sep. 11, 2012

(54) METHOD AND APPARATUS FOR ANALYZING A GROUP OF PHOTOLITHOGRAPHIC MASKS

(75) Inventors: Oliver Kienzle, Jena (DE); Rigo Richter, Zeulenroda-Triebes (DE); Norbert Rosenkranz, Reichenbach (DE); Yuji Kobiyama, Yokohama (JP); Thomas Scheruebl, Jena (DE)

(73) Assignee: Carl Zeiss SMS GmbH, Jena (DE)

( * ) Notice: Subject to any disclaimer, the term of this patent is extended or adjusted under 35 U.S.C. 154(b) by 250 days.

(21) Appl. No.: 12/597,247

(22) PCT Filed: Jul. 11, 2008

(86) PCT No.: PCT/EP2008/005678
§ 371 (c)(1),
(2), (4) Date: Mar. 1, 2010

(87) PCT Pub. No.: WO2009/007128
PCT Pub. Date: Jan. 15, 2009

(65) Prior Publication Data
US 2010/0157046 A1    Jun. 24, 2010

Related U.S. Application Data

(60) Provisional application No. 60/949,429, filed on Jul. 12, 2007.

(30) Foreign Application Priority Data

Jul. 12, 2007    (DE) .......................... 10 2007 033 243

(51) Int. Cl.
*H04N 7/18*    (2006.01)

(52) U.S. Cl. ........ 348/126; 348/131; 348/132; 382/144; 382/145; 382/146; 382/147; 382/148; 382/149; 382/150; 382/151

(58) Field of Classification Search .................. 348/126, 348/131, 132; 382/144–151
See application file for complete search history.

(56) References Cited

U.S. PATENT DOCUMENTS 6,738,859 B2 *    5/2004    Liebchen ........................ 716/51
(Continued)

FOREIGN PATENT DOCUMENTS
DE    103 60 536    5/2005

OTHER PUBLICATIONS

International Search Report for International Application No. PCT/EP2008/005678 dated Nov. 6, 2008.

(Continued)

*Primary Examiner* — Duyen Doan
(74) *Attorney, Agent, or Firm* — Fish & Richardson P.C.

(57) ABSTRACT

The invention relates to a method for analyzing a group of at least two masks for photolithography, wherein each of the masks comprises a substructure of a total structure, which is to be introduced in a layer of the wafer in the lithographic process, and the total structure is introduced in the layer of the wafer by introducing the substructures in sequence. In this method, a first aerial image of a first one of the at least two masks is recorded, digitized and stored in a data structure. Then, a second aerial image of a second one of the at least two masks is recorded, digitized and stored in a data structure. A combination image is generated from the data of the first and second aerial images, which combination image is represented and/or evaluated.

20 Claims, 4 Drawing Sheets

U.S. PATENT DOCUMENTS

| | | | |
|---|---|---|---|
| 6,757,886 B2 * | 6/2004 | Liebmann et al. | 716/54 |
| 6,765,651 B1 | 7/2004 | Fiekowsky et al. | |
| 7,107,571 B2 | 9/2006 | Chang et al. | |
| 7,180,576 B2 * | 2/2007 | Hansen | 355/67 |
| 7,471,375 B2 * | 12/2008 | Finders et al. | 355/67 |
| 7,684,013 B2 * | 3/2010 | Hansen et al. | 355/67 |
| 2002/0164065 A1 | 11/2002 | Cai et al. | |
| 2004/0129895 A1 * | 7/2004 | Goldstein et al. | 250/492.2 |
| 2004/0142251 A1 | 7/2004 | Hsu et al. | |
| 2004/0243320 A1 * | 12/2004 | Chang et al. | 702/30 |
| 2005/0221231 A1 * | 10/2005 | Fritze et al. | 430/311 |
| 2006/0000964 A1 * | 1/2006 | Ye et al. | 250/208.1 |
| 2006/0099538 A1 * | 5/2006 | Park et al. | 430/394 |
| 2006/0114453 A1 * | 6/2006 | Goldenshtein et al. | 356/237.1 |
| 2006/0215140 A1 * | 9/2006 | Dirksen et al. | 355/69 |
| 2007/0020565 A1 | 1/2007 | Koh et al. | |
| 2008/0170773 A1 * | 7/2008 | Wihl et al. | 382/144 |

OTHER PUBLICATIONS

Stewart A. Robertson et al., "The Modeling of Double Patterning Lithographic Processes", *SPIE*, vol. 6520, No. 65200J (2007).

* cited by examiner

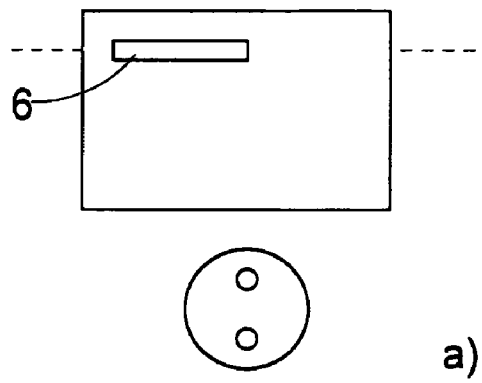
a)
a)
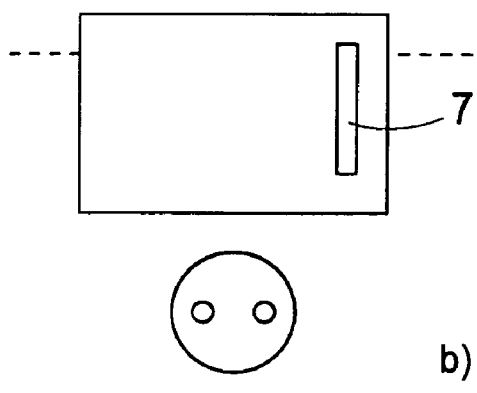
b)
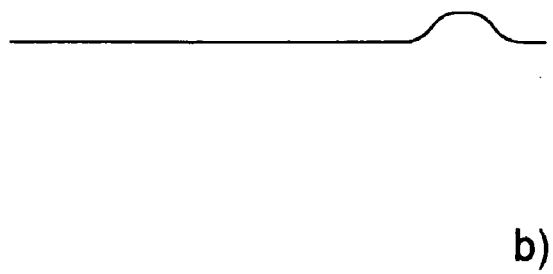
b)
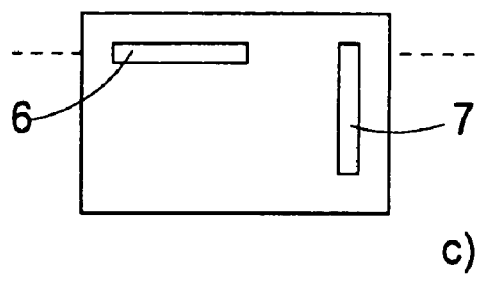
c)
c)
Fig.2
Fig.3 a)

b)

c)

d)

METHOD AND APPARATUS FOR ANALYZING A GROUP OF PHOTOLITHOGRAPHIC MASKS

This application is the National Stage of International Application No. PCT/EP2008/005678, filed Jul. 11, 2008, which claims priority to German Application No. 10 2007 033 243.4, filed Jul. 12, 2007 and U.S. Provisional Patent Application Ser. No. 60/949,429, filed on Jul. 12, 2007. The contents of these applications are hereby incorporated by reference in their entireties.

FIELD OF THE INVENTION

The invention relates to a method for analyzing a group of at least two masks for photolithography, wherein each of the masks comprises a substructure of a total structure, which is to be introduced in a layer of a wafer in the lithographic process, and the total structure is introduced in the layer of the wafer by introducing the substructures in sequence. The invention also relates to an apparatus for analyzing such a group of masks.

STATE OF THE ART

In the manufacture of semiconductor structures of the type used for processors in computer technology and increasingly used recently also in changeable storage media, there is a trend to producing ever-smaller structures on the same surface area. Presently available computer chips consist of approximately thirty different, superimposed layers, the size of the functional structures—the so-called features—being approximately 45 nm. The photolithographic masks used for producing said features have to be manufactured with accordingly high accuracy. A wafer is, thus, exposed up to thirty times. However, each layer requires a different mask. For this reason, it is required for the masks to be manufactured very precisely, on the one hand, and to be positioned very precisely, on the other hand, so that the layers are exactly aligned with respect to each other.

So-called double- or multiple-exposure processes have been developed recently in order to generate even smaller structures within one single wafer layer of this type. What they have in common is that the total structure to be introduced in the wafer layer is divided into different substructures and a group of masks is generated or provided, respectively, wherein each mask of the group has a substructure which differs from the substructures of the other masks. Therefore, in order to generate the total structure in the selected wafer layer, the latter has to be exposed with all masks having different substructures so that the total structure which had been originally defined in the mask design results in the end. Depending on the desired resolution, double exposures are already sufficient in case of a suitable design. Two different types of exposure are distinguished here.

During the actual double or multiple exposure, respectively, the photoresist, i.e. the photo-sensitive lacquer on the wafer, is exposed twice with two different masks. This method is used, in particular, for more complex structures where the combination of special illumination settings has advantages for the contrast of the imaging system. Using two masks, dipole illumination can be provided, for example, with the dipole axes of both illuminations being perpendicular to each other. In this method, the resolution can be improved by increasing the contrast, which allows a slightly higher density of the structures in certain circumstances. However, this method does not allow to achieve great changes in the density of the structures.

Another double- or multiple-exposure method is the so-called double patterning. In this method, the layer of the wafer is also exposed twice. However, after the first exposure, the photoresist/photo-sensitive lacquer is developed and the wafer is etched. Various double-patterning methods are known in the prior art and are disclosed, for example, in Proc. SPIE Vol. 6520, 65200H-1-7 (2007) and in Proc. SPIE, Vol. 6520, 65201C-1-9 (2007). For example, after the first exposure, developing and etching, the prominent structures present in places where no exposure has taken place can be provided with so-called spacers, before applying another coat of photoresist. Another possibility is to cure the photoresist which has not been exposed and not developed, before applying a second coat of photoresist. In this case, the wafer need not be etched after the first exposure. A further possibility consists in coating the wafer layer for this purpose with a hard mask before exposure and before applying the photoresist. Due to the development following the exposure, the exposed sites on the hard mask are uncovered, then etched, and the underlying layers of the wafer are uncovered. Next, another coat of photoresist is applied and exposed, developed and etched once more. Using, for example, two masks having a line-shaped pattern, with a spacing d between the lines in both masks, double patterning allows to generate twice the number of lines in the wafer layer with a spacing of d/2, which is also referred to as pitch doubling. Although the manufacture of a normal mask is already very expensive and costly, the costs and complexity are further increased in the manufacture of such a group of masks. Not only is there a multiplicity of masks, but when exposing the wafer care has to be taken to exactly align the masks upon each other, so as to avoid any overlay error when superimposing the structures upon each other. The overlay error is the main source of error that can occur when two or more masks are supposed to interact on the scanner. Said error consists of several contributing factors, but the main contributing factor is usually the overlay error of the masks and the overlay error of the photolithographic scanner. In the total exposure, the overlay error may appear as an error in the spacing between the structures and/or as an error in the critical dimension. Moreover, when separating the mask design, critical areas may be formed in which conflicts may arise during exposure. This applies, for example, to structures which are spread over two masks and whose edges contact each other in the total structure.

Such errors in multiple exposures are presently recognized only by the analysis of test series of wafers. Although the manufacture of wafers is relatively inexpensive, this procedure is very time-consuming.

On the other hand, aerial image analysis, for example using the AIMS of Carl Zeiss SMS GmbH, has been known for a long time for the analysis and final inspection of photomasks under lithographic conditions. In this case, the mask is exposed using the same illumination settings and at the same wavelength as those subsequently used during photolithography. In contrast to photolithography, where the mask structure is imaged onto the wafer with strong reduction in size, the AIMS generates enlarged aerial images, which are imaged onto a detecting unit, for example a CCD camera, are digitized and stored. Thus, the aerial image corresponds to the image generated in the photolithographic scanner on the photoresist layer. The photolithographic mask can be examined for correct lithographic behavior with the help of the AIMS, without having to expose expensive test series.

However, so far, only an analysis of individual masks has been possible. The AIMS does not allow to examine the interaction of two or more masks of a group as described above, so that an assessment of defects or of the correct critical dimension in masks for double-exposure methods is presently not possible by an aerial image analysis.

DESCRIPTION OF THE INVENTION

Therefore, it is the object of the invention to develop a method for analyzing a group of at least two masks for photolithography, by which method this problem is solved.

The object is achieved by a method for analyzing a group of at least two masks for photolithography, wherein each of the masks comprises a substructure of a total structure, which is to be introduced in a layer of a wafer in the lithographic process, and the total structure is introduced in the layer of the wafer by introducing the substructures in sequence, wherein a first aerial image of a first one of the at least two masks is recorded, digitized and stored in a data structure, a second aerial image of a second one of the at least two masks is recorded, digitized and stored in a data structure, a combination image is generated from the first and second aerial images, and the combination image is represented and/or evaluated.

Depending on how the first and second aerial images are combined to form a combination image, the above-described double- or multiple-exposure methods can be simulated. If recording is effected using a CCD camera, said camera usually comprises a matrix of pixels. The first and second aerial images are then preferably recorded as pixels. In this case, two-dimensional matrices are preferably used as the data structure, said matrices storing at least the intensity values for each pixel. In addition, other values, such as e.g. polarization conditions, can also be stored as further data in the data structures. However, in the simplest case, the data are exclusively the intensity values.

The first and second aerial images can be recorded here with different illumination settings, such as, for example, mutually orthogonal dipole illumination. It goes without saying that other illumination settings, such as quadrupole illumination, etc., can be used as well.

In a particularly preferred embodiment of the method, the data of the first and second aerial images, i.e. the intensity values, are added pixel by pixel to form the combination image. This allows to simulate the above-described actual double exposure, wherein the same photoresist layer is exposed twice on a wafer using two different masks. This combination image can then be represented on a screen or subjected to semi-automatic or automatic evaluation, for example with respect to the critical dimension. After generating the combination image, it is also possible to carry out a further step and modify the data of the combination image by means of a photoresist simulation. A simple and, therefore, convenient photoresist simulation consists in subjecting the data of the combination image to folding with a Gaussian function in a first step and to a threshold function in a second step. The modified data correspond to the image of the exposed and developed photoresist/photo-sensitive lacquer layer on the wafer layer. Moreover, in a third step, a further function which simulates etching can be applied to the modified data so that the further modified data correspond to a structure introduced in the layer of the wafer. In this manner, the image of the exposed and etched wafer is obtained.

In another embodiment of the invention, the data of the first aerial image are modified by means of a photoresist simulation after recording, and the combination image is generated by modifying the data of the second aerial image by means of said photoresist simulation, taking into consideration the modified data of the first aerial image. This allows to simulate the so-called double patterning. The data of the first aerial image or the recorded intensity values, respectively, serve as input values for the photoresist simulation. During said photoresist simulation, the intensity values of the first aerial image are applied, for example, to a simulated system of—from bottom to top—a wafer layer, a hard mask layer, as well as a photoresist layer. Even a simulation of the other double patterning methods which are known in the prior art and some of which have been discussed above is possible, of course, by suitable selection of parameters. However, the selected example of the use of a hard mask layer is particularly plausible, so that the method will be explained exclusively with reference to said example. For the sake of simplicity, further layers used in reality, but not needed in simulation—such as a BARC (bottom anti-reflecting coating) layer or a top coating on the photoresist in the case of lithography using immersion optics—will not be taken into consideration in the description either. In those places where the aerial image has a high intensity above a predetermined threshold value, the photoresist is removed from the layer system in the photoresist simulation. The modified data correspond to a developed photoresist image on the layer of the wafer. In a further step, an etching process is simulated which selectively removes only the hard mask layer at the sites uncovered during simulation of the developing operation. The structure etched into the hard mask layer, which uncovers the underlying wafer layer, is obtained as output data. They can be stored in the same data structure as the first aerial image and overwrite the data therein. However, while the intensity values of the aerial image may assume a multiplicity of different absolute values, a set of binary data is sufficient as output data after photoresist simulation, which, in the case of a double patterning simulation, expressly also includes here an etching simulation; this is because the hard mask layer has either been removed pixel by pixel or is still present on the wafer. Thus, the modified data obtained from the photoresist simulation of the first aerial image correspond to this dataset of preferably binary data.

The same procedure is applied to the data of the second aerial image, which are also modified by a photoresist simulation. However, in doing so, the modified data of the first aerial image, i.e. the output data of the photoresist simulation, are taken into consideration, since the photoresist simulation already assumes the hard mask layer as having been removed at the sites which have been previously exposed, developed and etched. Taking the result of the first photoresist simulation into consideration, the output data of this second photoresist simulation then form the combination image, which corresponds to the twice etched hard mask layer on the wafer. In an additional step, a further etching operation can then be simulated by which the uncovered portions of the wafer are etched away and those portions located beneath the hard mask layer are preserved. In reality, a different etching process is used for this purpose. Next, the still remaining hard mask layer can be removed. However, these steps are not absolutely required in the simulation, because the combination image already contains the total structure in the hard mask layer. This combination image can then be further analyzed.

Double patterning can also be simulated more simply by first applying a photoresist simulation separately to the data of each of the two aerial images after recording and, thus, generating modified data for each of the aerial images, preferably followed by etching. Next, the combination image is assembled from the modified data of both aerial images. In doing so, the data of both aerial images are compared pixel by pixel, and the respectively lower value is included in the combination image. The difference to the previously described variant consists in neglecting the effects which the first exposure and, where applicable, the etching operation have on the second exposure and which result in a structured surface that is no longer planar. For the photoresist simulation of the second aerial image it is also assumed that the surface located beneath the photoresist layer is approximately planar. Nevertheless, double patterning can also be simulated in this manner with very good approximation.

Photoresist simulators are commercially available, for example from companies such as Solid E, Panaramics or KLA Prolith. In a particularly simple embodiment of a photoresist simulation, however, the data of each of the aerial images are subjected to folding with a Gaussian function in a first step during photoresist simulation, by which function the intensity distribution is modified. In a second step, a threshold function which corresponds to developing is applied to the obtained data. If the value is above the threshold, developing takes place, and if said value is below a threshold, developing does not take place. In a third step, a further function which simulates an etching operation is applied so that the modified data correspond to a structure introduced in the layer of the wafer. However, in the case of double exposure, this wafer layer initially corresponds to a hard mask layer, and it is not until the end that the hard mask layer is removed in the simulation and the structure introduced in the wafer remains.

Since the considerable new error in multiple-exposure methods consists in that the masks are possibly not exactly aligned with respect to each other, an important part of the evaluation consists in analyzing the overlay error or its effects, respectively. Therefore, in a particularly preferred embodiment of the method, a shifting function is applied to the data of one of the two aerial images after recording and before generating the combination image, which shifting function laterally shifts one of the two aerial images. Said shifting allows to simulate an overlay error and to analyze the maximum overlay errors allowable without affecting the total structure.

It is also possible, of course, to apply the combination of the recording of an aerial image, followed by a photoresist simulation as well as an etching simulation, also to other masks which are not designed for multiple exposure methods, but for single exposure methods. Thus, the method can also be modified such that an aerial image of a photolithographic mask is recorded, digitized and stored in a data structure and the data of the aerial image are modified by means of a photoresist simulation. Compared with the known analysis of only the aerial image, this procedure has the advantage of yielding a better description of the mask's behavior during actual lithography. Of course, the quality of said description also depends on the quality of the simulation program. While the aerial image only contributes the mask itself to the simulation of photolithography, the photoresist simulation contributes to the image of the photoresist on the wafer layer.

In a simple photoresist simulation—with analogy to the above-described cases of double exposure and multiple exposure—the data of the aerial image are subjected to folding with a Gaussian function in a first step and to a threshold function in a second step, so that the modified data correspond to a photoresist image on the layer of the wafer. In a third step, a further function, which simulates an etching operation, is applied to the modified data so that the further modified data correspond to a structure introduced in the layer of the wafer.

The object is also achieved by an apparatus for analyzing a group of at least two masks for photolithography, wherein each of the masks comprises a substructure of a total structure, which is to be introduced in a layer of the wafer in the lithographic process, and the total structure is introduced in the layer of the wafer by introducing the substructures in sequence. Such an apparatus is suitable, in particular, to carry out the method according to the invention, and comprises a device for recording aerial images of the masks and an evaluating unit, and the device for recording aerial images of the masks is provided such that it records, digitizes and stores in a data structure a first aerial image of a first one of the at least two masks and records, digitizes and stores in a data structure a second aerial image of a second one of the at least two masks. The evaluating unit is provided such that it generates a combination image from the data of the aerial images of the masks and represents and/or evaluates said combination image.

The device for evaluating the aerial images preferably comprises a mask support, which receives a mask—or one mask after the other in the case of a group of at least two masks. The evaluating device further comprises an illuminating device by which the mask is illuminated under the same conditions as in photolithography. This also includes, in particular, homogenization of the beam, light having a wavelength of e.g. 193 nm, optical means for illuminating an illumination pupil, etc. Moreover, the apparatus comprises a detecting device by which an aerial image of the mask is detected and digitized, as well as imaging optics by which a section of the mask is imaged—magnified or reduced in size—onto the detecting device. A suitable magnification allows to image the entire mask at once onto the detecting device in order to obtain an overview. However, the mask is usually imaged in sections, and the respective aerial image can be assembled from the imaged sections.

In this case, the mask support is conveniently movable in a plane perpendicular to the optical axis, so that all sections of the mask, or the mask as a whole, can be accessed by the imaging optics.

The detecting device preferably comprises a CCD camera for registration of intensities; other detecting devices, such as sensors based on CMOS technology, can also be used. The essential factor is that the intensity of the light can be registered and converted into digital signals.

Since a mask usually has a profile which results in an extent along the optical axis (direction of z), the imaging optics conveniently comprise a microscope objective which is movable along the optical axis by means of a piezo drive, so that focusing on all areas of the mask is possible, regardless of their height with respect to a reference plane. In addition or as an alternative, the mask support may also be movable in the direction of z.

In a preferred embodiment of the invention, the device for recording aerial images records the first and second aerial images with different illumination settings. Thus, the illumination setting can be varied. This setting is advantageous, in particular, in the simple case that double exposure of one single photoresist layer is to be simulated. For example, the first and second aerial images can be recorded with mutually orthogonal dipole illumination. Other illumination settings, such as quadrupole illumination, etc., can also be used, of course.

In a further preferred embodiment of the invention, the evaluating unit applies to the data of one of the two aerial images a shifting function which laterally shifts said aerial image. This is advantageous, in particular, when examining overlay errors or when examining the maximum overlay error which is still possible without affecting the total structure. The detecting device conveniently detects the aerial images as pixels, in which case the number of pixels may correspond, for example, to the so-called pixel resolution of the CCD camera.

In a preferred embodiment of the apparatus according to the invention, the evaluating unit adds the data of the aerial images pixel by pixel in the combination image. Together with the variation of the illumination settings, this corresponds to the simulation of the simple double exposure of one single photoresist layer through two masks. Moreover, the evaluating unit can be provided with a photoresist simulator which modifies the data of the combination image and simulates developing with subsequent etching. As a result, the combination image then corresponds to the structured wafer. In another embodiment of the invention, the evaluating unit is provided with a photoresist simulator which modifies the data of the first aerial image after recording, and the evaluating unit generates the combination image by modifying the data of the second aerial image by means of the photoresist simulator, taking into consideration the modified data of the first aerial image. The modification of the data is effected according to the steps described above for the method according to the invention. The combination image obtained will be the wafer layer with the double-etched hard mask coating, and the subsequent etching of the wafer and the removal of the hard mask coating can be simulated in further steps. If the parameters of the photoresist simulator are set accordingly, the apparatus may also be used to simulate other multiple exposure methods which are mentioned in the prior art and some of which are briefly outlined in the introduction. However, double patterning using a hard mask layer is particularly plausible and has, therefore, been used as an example.

It goes without saying that the aforementioned features and those yet to be explained below can be used not only in the combinations mentioned, but also in any other combinations or alone, without departing from the scope of the present invention.

BRIEF DESCRIPTION OF THE DRAWINGS

The invention will be explained in more detail below, by way of example and with reference to the enclosed drawings, which also disclose features essential to the invention and wherein:

FIGS. 2a to 2c show the basic procedure of double exposure of a photoresist layer on a wafer using two different masks;

FIGS. 3a to 3c show intensity profiles matching the structures of FIG. 2;

DETAILED DESCRIPTION OF THE DRAWINGS

Figure 1:
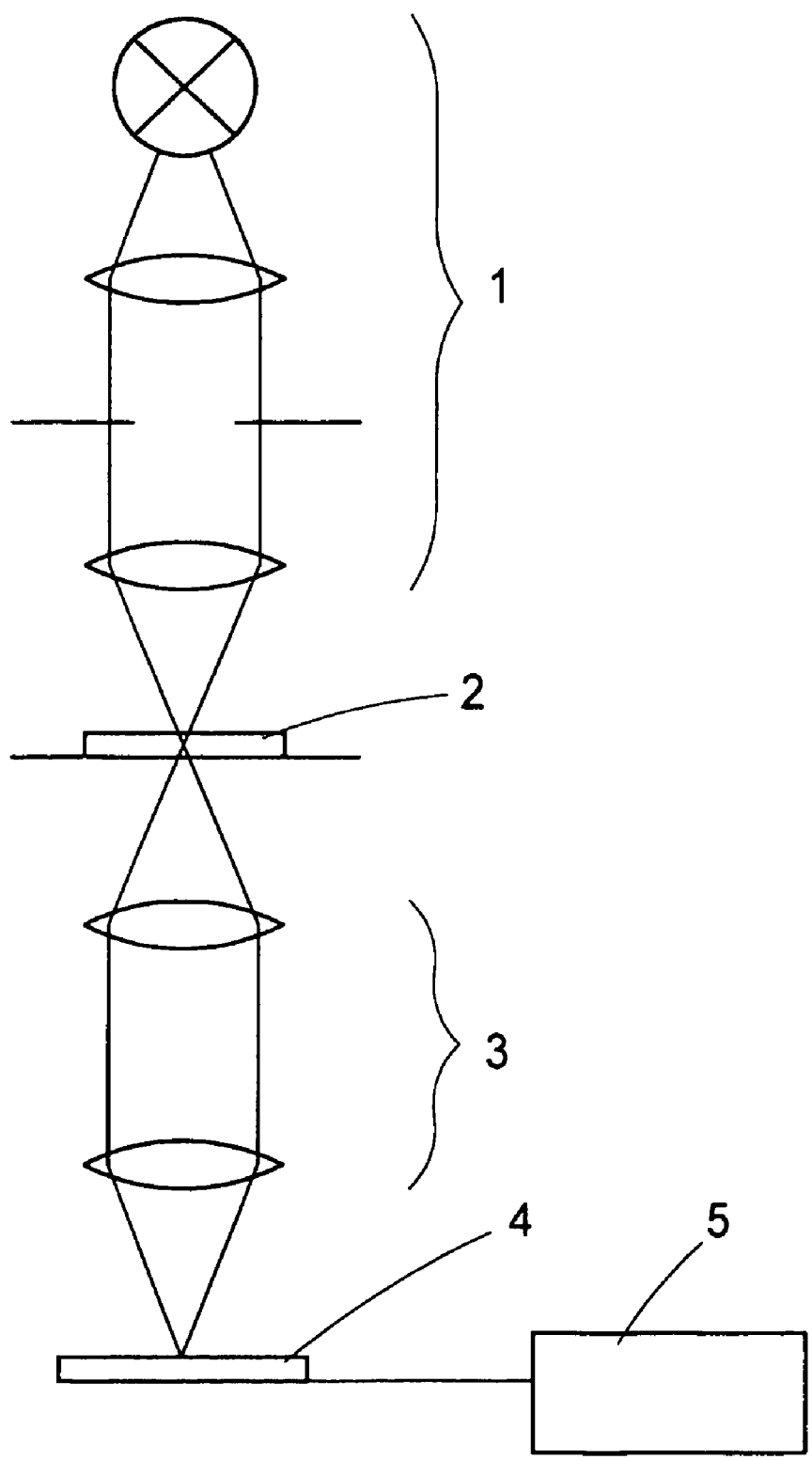
FIG. 1 shows an apparatus for analyzing a group of at least two masks.

First of all, FIG. 1 shows an apparatus by which a group of at least two masks for photolithography can be examined, each of said masks comprising a substructure of a total structure, which is to be introduced in a layer of a wafer in the photolithographic process, and the total structure is introduced in each layer of the wafer by introducing the substructures in sequence. The apparatus comprises, first of all, a device for recording (or generating) aerial images of the masks. Said device comprises an illuminating device 1 including a laser light source of, for example, 193 nm, means for beam homogenization, as well as means allowing to vary the illumination setting, so that switching is possible, for example, between different settings for sample illumination. Said device further comprises a mask support 2, which receives a photolithographic mask. The photolithographic masks are sequentially inserted in the mask support 2 and aerial images are generated. The photolithographic mask itself is not shown. The photolithographic mask is illuminated by the illuminating device 1 under the same conditions as in photolithography. Imaging optics 3 are used to image the photolithographic mask onto a detecting device which comprises, inter alia, a CCD camera 4. An aerial image of the mask is detected and digitized by the detecting device. The data are then transmitted to an evaluating unit 5, where they are initially stored in data structures. The device for generating the aerial images of the masks first records a first aerial image of a first one of the at least two masks, digitizes said image and transmits it to the evaluating unit, where said image is stored in a data structure; then, said device records a second aerial image of a second one of the at least two masks, also digitizes said image and transmits it to the evaluating unit 5, where this image is also stored in a data structure. Next, the evaluating unit 5 generates a combination image from the data of the aerial images of the masks. A graphic representation of the combination image is also possible.

The mask support 2 can be moved in a plane perpendicular to the optical axis, so that different positions on the mask can be reached. The imaging optics 3 comprise a microscope objective which is movable along the optical axis by means of a piezo drive, thus enabling adaptation to different heights on the mask. The illuminating device 1 may be provided such that the first and second aerial images are recorded with different illumination settings, for example with mutually orthogonal dipole illuminations. Other types of illumination, such as quadrupole illumination, or simple illumination are also possible, and a generalization from two to more masks—i.e. the recording of N aerial images, if the mask design is spread over N masks, and generating a combination image from all these aerial images—is also easily possible. The evaluating unit 5 can apply to the data of the aerial images a shifting function, which shifts, for example, one of the two aerial images relative to the other in the plane perpendicular to the optical axis. With reference to the aerial images, this allows to analyze the effects of overlay errors. It is even possible to determine a maximum allowed overlay error which does not affect the total structure.

The illustrated apparatus can be used both to analyze multiple exposures of the same photoresist layer and to analyze multiple exposures according to the double patterning method, as will be explained in more detail below. FIGS. 2a to 2c initially show, with reference to a simple example, the sequence of a double exposure of the same photoresist layer. FIGS. 3a to 3c correspondingly show the associated aerial images and the combination image generated by the evaluating unit 5 in a sectional view along the dashed line of FIGS. 2a to 2c.

FIG. 2a shows a first mask comprising a horizontal structure 6. In this case, vertical dipole illumination perpendicular to the expansion of the structure is suitable for high contrast. This is represented in FIG. 2a by the large circle with the two smaller circles contained therein, which are located below the mask. The intensity distribution of the aerial images shown in a sectional view in FIG. 3a results. FIG. 2b shows the second mask with a vertical structure 7. Below this, the corresponding illumination setting with dipole illumination orthogonal to the first illumination setting is shown and FIG. 3b shows the intensity distribution in the associated aerial image. The exposure with both substructures of FIG. 2a and FIG. 2b results in the total structure shown in FIG. 2c. Accordingly, the combination image shown in FIG. 3c is obtained by addition the aerial images of FIGS. 3a and 3b pixel by pixel. Of course, other structures and other illuminating devices can also be used, and the illumination settings can also be identical for the different masks.

The combination image shown in FIG. 3c is then evaluated, using known methods, automatically in the evaluating unit and/or manually. In particular, a shift may be added to one of the two aerial images before generating the combination image, which shift has the effect, for example, that the intensity peak in FIG. 3b moves to the left. Moreover, the combination image shown in FIG. 3c can be modified with the help of a photoresist simulator. This means that the data of the combination image serve as input data for the photoresist simulator, that several functions are applied to this dataset and that an output dataset is generated which corresponds to an image of the wafer structure that is actually to be generated.

In the simplest case, such a photoresist simulator consists in that, first of all, the intensity distribution of the aerial image, such as it would be generated on the surface of the photoresist by exposure through the mask, is folded with a Gaussian function. This corresponds to the simulation of the diffusion of activated photoresist molecules. Next, a threshold function simulating the actual developing is applied to the data. If the intensities are above a predetermined threshold, developing takes place at this site, and if the intensity is below the predetermined threshold, the photoresist remains on the wafer layer. In a further step, an etching simulation may take place, by which material is removed from the surface of the uncovered wafer layer.

This allows to analyze the interaction of both masks during double exposure of a wafer layer and to examine important process parameters, such as, for example, the critical dimension, or defects.

The use of the above-described apparatus also allows to evaluate multiple exposure and the interaction of several masks in double patterning methods. FIGS. 4a to 4d show the basic procedure for generating dense structures on a wafer by means of the double patterning method. FIGS. 5a to 5i show the procedure by which the combination image is generated.

Figure 4:
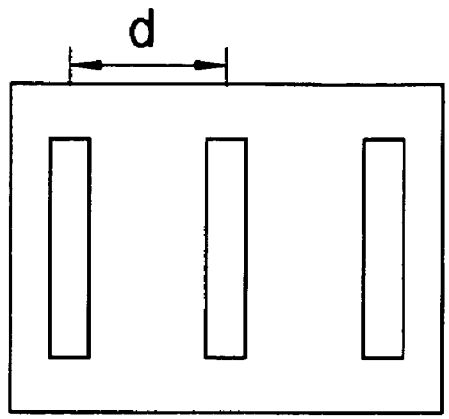
FIGS. 4a to 4d show the principle of double exposure in double patterning.
Figure 4:
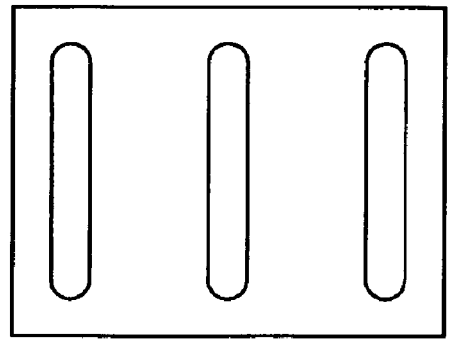
Figure 4:
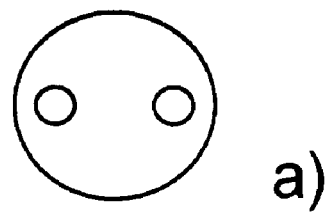
Figure 4:
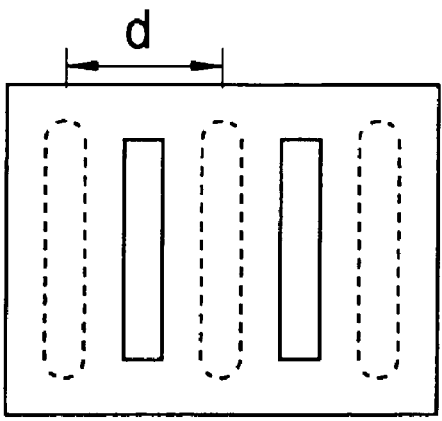
Figure 4:
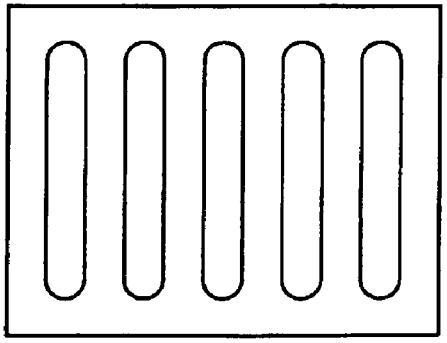
Figure 4:
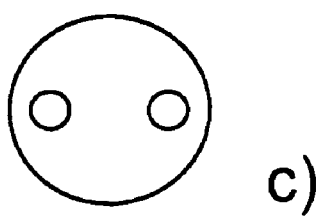

First of all, FIG. 4a shows a first mask comprising three vertical structures with a spacing d between them. Illumination is effected, for example, by means of dipole illumination perpendicular to the longitudinal expansion of the structures, as indicated at the bottom of the figure. In a first step, a photoresist present on a wafer, which is in turn coated with a hard mask layer, is now illuminated through the mask, and the mask is imaged onto the photoresist layer. This is followed by developing and etching, which results in the image depicted in FIG. 4b. Due to the dipole illumination, the structures have a high contrast in a horizontal direction, but not in a vertical direction, which leads to the corners being rounded off. The wafer is then coated with a new photoresist layer, and then a further mask comprising two vertical structures, which are located exactly between the vertical structures of the first mask, is used to expose the photoresist once more. This is shown in FIG. 4c. The structures generated by exposure with the first mask are concealed by the photoresist layer and are therefore indicated only in dashed lines. Finally, in the last step, developing and, once again, etching take place, resulting in the image shown in FIG. 4d. The structure on the wafer now consists of lines with a spacing of d/2 between them, and the resolution has been effectively doubled as compared to the use of one single mask.

Figure 5:
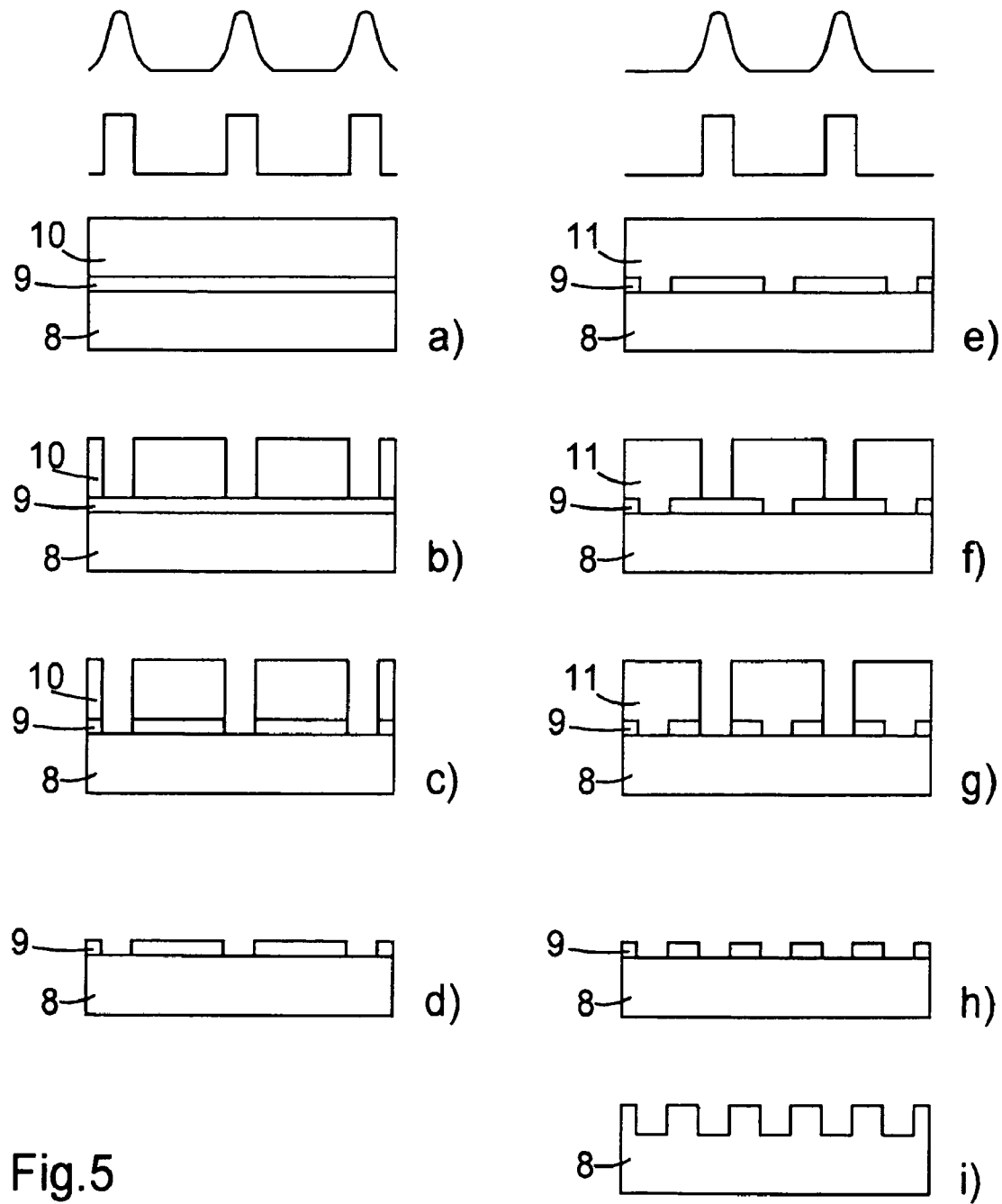
FIGS. 5a to 5i show the sequence of the method for generating a combination image during simulation of the double patterning method.

FIG. 5 shows the procedure of simulating such double patterning exposure, again exemplified by the use of a hard mask layer. First of all, a first aerial image of the first mask is recorded, digitized and stored in a data structure. These data correspond approximately to a continuously differentiable intensity distribution, as shown at the very top of FIG. 5a. The data are then modified by a photoresist simulation. Thus, in the simplest case, they are folded with a Gaussian function, and a threshold function is applied to the resulting data. In this manner, the step function shown in the middle is obtained. In those places where the mask transmits light, there is a high intensity, and the center of such a step is also located there. The step function or the distribution of values, respectively, shown in the middle of FIG. 5a is then applied to a layer system of the type shown in the lower part of FIG. 5a. The layer system consists of a wafer layer 8 onto which a hard mask layer 9 is applied. The hard mask layer 9 has a photoresist layer 10 thereon.

The next step in photoresist simulation consists in removing the photoresist at those sites of the photoresist layer 10 at which the step function obtained in the first step of the simulation is not zero. As a result, the image shown in FIG. 5b is obtained. At the sites where the photoresist has been exposed, it has been removed by developing and part of the underlying hard mask layer 9 has been uncovered. In a subsequent step, etching is simulated, whereby the hard mask layer 9 is removed at the uncovered sites. In this manner, by modifying the data of the first aerial image, a simulated image of the wafer as it would result after exposure of the first mask is obtained. The structure resulting after removal of the photoresist is shown in FIG. 5d.

Next, an aerial image of the second mask is recorded. The resulting intensity distribution stored in the data structure is shown in a sectional view at the top of FIG. 5e. These data of the second aerial image are again modified in connection with a photoresist simulation. The step function shown in the central part of FIG. 5e is obtained after folding with a Gaussian function and after applying a threshold function. Said step function is applied to a photoresist layer 11 in the next step of the photoresist simulation. In doing so, the photoresist layer 11 has been applied—virtually—onto the structure which resulted from the modification of the data of the first aerial image in photoresist simulation, as shown in the lower part of FIG. 5e. As a result, the image shown in FIG. 5f is obtained, the photoresist is removed at those sites where the modified intensity distribution has steps, and the hard mask layer 9 is uncovered. In the next step shown in FIG. 5g, the uncovered hard mask layer 9 is in turn removed by etching; then, the still remaining photoresist layer 11 can be removed by rinsing, resulting in the image shown in FIG. 5h. In a final step, the etching of the wafer itself can be simulated, and the hard mask layer 9 can be removed. The result is shown in FIG. 5i. The stepped structure shown in FIG. 5h or FIG. 5i, respectively, corresponds to the combination image, which can then be further analyzed by known methods or manually. In particular—prior to the simulation—one of the two aerial images can also be subjected to an overlay error, i.e. to a shift in the x-y plane perpendicular to the optical axis. This allows, for example, to determine the maximum overlay error allowable without affecting the total structure. For example, this is important where—unlike in the case shown as an example—not just parallel lines, but more complex structures, are to be introduced in a wafer layer and where, by correct exposure, a structure generated using the first mask is to merge seamlessly with a structure generated using the second mask. Although there have been attempts to avoid such critical areas when spreading out the mask design, this is not always possible. The simulation of an overlay error allows a more precise analysis of the behavior in the critical areas and, thus, also to define maximum tolerances.

The above-described apparatus and method make it possible to evaluate the mask design spread over different masks for the double exposure method by the combination of aerial images with or without modification and, for the first time, the interaction of the masks in generating the total structure on a wafer can be evaluated on the basis of a simulation. Thus, expensive test series in wafer production for checking the mask quality can be dispensed with.

LIST OF REFERENCE NUMERALS

1 Illuminating device
2 Mask support
3 Imaging optics
4 CCD camera
5 Evaluating unit
6 Horizontal structure
7 Vertical structure
8 Wafer layer
9 Hard mask layer
10 Photoresist layer
11 Photoresist layer
d Spacing

The invention claimed is:

1. A method for analyzing a group of at least two masks for photolithography, wherein each of the masks comprises a substructure of a total structure, which is to be introduced in a layer of a wafer in a lithographic process by introducing the substructures in sequence in the layer of the wafer, wherein
   a first aerial image of a first one of the at least two masks is recorded, digitized and stored in a data structure;
   a second aerial image of a second one of the at least two masks is recorded, digitized and stored in a data structure, in which the first and second aerial images are recorded with different illumination settings;
   a combination image is generated from the data of the first and second aerial images, and the combination image is represented and/or evaluated, wherein:
   the data of the first and second aerial images are added pixel by pixel to form the combination image, and
   the data of the combination image are modified by photoresist simulation,
   wherein the data of the combination image are subjected to folding with a Gaussian function in a first step and to a threshold function in a second step, so that the modified data correspond to a developed photoresist image on the layer of the wafer.

2. The method as claimed in claim 1, wherein the first and second aerial images are recorded as pixels.

3. The method as claimed in claim 1, wherein the first and second aerial images are recorded using mutually orthogonal dipole illumination.

4. The method as claimed in claim 1, wherein, in a third step, a further function which simulates etching is applied to the modified data, so that the further modified data correspond to a structure introduced in the layer of the wafer.

5. The method as claimed in claim 1, wherein the data of the first and second aerial images are each modified after recording by means of a photoresist simulation and that the combination image is composed from the modified data of both aerial images.

6. The method as claimed in claim 1, wherein the data of the first aerial image are modified by a photoresist simulation after recording and that the combination image is generated by modifying the data of the second aerial image by means of the photoresist simulation, taking into consideration the modified data of the first aerial image.

7. The method as claimed in claim 5, wherein, in a first step, the data of each of said aerial images are subjected to folding with a Gaussian function in a first step during photoresist simulation and to a threshold function in a second step, so that the modified data correspond to a developed photoresist image on the layer of the wafer.

8. The method as claimed in claim 7, wherein, in a third step, a further function which simulates etching is applied to the modified data so that the further modified data correspond to a structure introduced in the layer of the wafer.

9. The method as claimed in claim 1, wherein, after recording and before generating the combination image, a shifting function is applied to the data of one of the two aerial images, said shifting function shifting one of the two aerial images laterally.

10. A method for analyzing a group of at least two photolithographic masks, comprising:
    recording a first aerial image of a first one of the two photolithographic masks;
    recording a second aerial image of a second one of the two photolithographic masks;
    digitizing the first and second aerial images;
    storing the first aerial images in a data structure;
    storing the second aerial images in a data structure;
    modifying the data of the first aerial image by using a photoresist simulation after recording, and
    generating a combination image by modifying the data of the second aerial image by using the photoresist simulation, taking into consideration the modified data of the first aerial image;
    wherein modifying the data of the first and second aerial images comprises subjecting the data of each of the first and the second aerial images to folding with a Gaussian function in a first step during photoresist simulation and to a threshold function in a second step, so that the modified data correspond to a photoresist image on the layer of the wafer.

11. The method as claimed in claim 10, wherein, in a third step, a further function which simulates etching is applied to the data so that the further modified data correspond to a structure introduced in the layer of the wafer.

12. Apparatus for analyzing a group of at least two masks for photolithography, wherein each of the masks comprises a substructure of a total structure, which is to be introduced in a layer of a wafer in the lithographic process by introducing the substructures in sequence in the layer of the wafer, said apparatus comprising:
    a device for recording aerial images of the masks; and an evaluating unit;
    wherein said device for recording aerial images of the masks records, digitizes and stores in a data structure a first aerial image of a first one of the at least two masks and records, digitizes and stores in a data structure a second aerial image of a second one of the at least two masks, and the first and second aerial images are recorded with different illumination settings, and
    the evaluating unit generates a combination image from the data of the aerial images of the masks by adding the data of the first and second aerial images pixel by pixel, and represents and/or evaluates said combination image, and
    wherein the evaluating unit comprises a photoresist simulator that modifies the data of the combination image by photoresist simulation, wherein the data of the combination image are subjected to folding with a Gaussian function in a first step and to a threshold function in a second step, so that the modified data correspond to a developed photoresist image on the layer of the wafer.

13. Apparatus as claimed in claim 12, wherein the device for recording aerial images comprises
a mask support including a mask;
an illuminating device by which the mask is illuminated under the same conditions as in photolithography;
a detecting device by which an aerial image of the mask is detected and digitized, and
imaging optics by which a section of the mask is imaged onto the detecting device.

14. Apparatus as claimed in claim 13, wherein the mask support can be moved in a plane perpendicular to the optical axis.

15. Apparatus as claimed in claim 13, wherein the detecting device comprises a CCD camera.

16. Apparatus as claimed in claim 13, wherein the imaging optics comprise a microscope objective which is movable along the optical axis by means of a piezo drive.

17. Apparatus as claimed in claim 12, wherein the device for recording aerial images records the first and second aerial images with mutually orthogonal dipole illumination.

18. Apparatus as claimed in claim 12, wherein the evaluating unit applies to the data of one of the two aerial images a shifting function which laterally shifts said aerial image.

19. Apparatus as claimed in claim 12, wherein the detecting device detects the aerial images as pixels.

20. Apparatus as claimed in claim 12, wherein the photoresist simulator modifies the data of the first aerial image after recording, and the evaluating unit generates the combination image by modifying the data of the second aerial image by means of the photoresist simulator, taking into consideration the modified data of the first aerial image.

* * * * *